United States Patent [19]

Thomann

[11] 4,278,712
[45] Jul. 14, 1981

[54] METHOD FOR ACTIVATING NON-NOBLE METAL COLLOIDAL DISPERSION BY CONTROLLED OXIDATION FOR ELECTROLESS PLATING

[75] Inventor: Thomas G. Thomann, Trenton, N.J.

[73] Assignee: Surface Technology, Inc., Princeton, N.J.

[21] Appl. No.: 52,857

[22] Filed: Jun. 28, 1979

Related U.S. Application Data

[63] Continuation of Ser. No. 938,438, Aug. 31, 1978, abandoned.

[51] Int. Cl.³ .................................................. C23C 3/02
[52] U.S. Cl. .................................. 427/304; 106/1.11; 427/305; 427/306; 427/307
[58] Field of Search ............... 106/1.11; 427/304–306, 427/307

[56] References Cited

U.S. PATENT DOCUMENTS

| | | | |
|---|---|---|---|
| 3,011,920 | 12/1961 | Shipley | 427/304 |
| 3,958,048 | 5/1976 | Donovan | 427/304 |
| 3,993,799 | 11/1976 | Feldstein | 427/304 |
| 4,131,699 | 12/1978 | Feldstein | 427/304 |

OTHER PUBLICATIONS

Weiser, Inorganic Colloid Chemistry, vol. I, pp. 1–5; 137–143 and vol. II; pp. 149–171, C1933.

*Primary Examiner*—John D. Smith

[57] ABSTRACT

Metallic surfaces are imparted to non-conductors or dielectric substrates by electroless (chemical) plating process comprised of coating the substrates with activated colloid(s) of non-precious metals and wherein the activated colloids are prepared by the controlled oxidation of weakly active colloids.

19 Claims, No Drawings

METHOD FOR ACTIVATING NON-NOBLE METAL COLLOIDAL DISPERSION BY CONTROLLED OXIDATION FOR ELECTROLESS PLATING

This is a continuation of application Ser. No. 938,438 filed Aug. 31, 1978, now abandoned.

BACKGROUND OF THE INVENTION

In the plating of dielectric substrates by chemical (electroless) plating it is well known that suitable catalytic pretreatment is a prerequisite for effective electroless metal deposition. Such practices are well known and accepted in the art.

In examining the prior art for catalytic pretreatment it appears that while different procedures have been used, the incorporation of precious metals (e.g., palladium containing solutions) was common to all procedures. One catalytic system of particular interest is the two step process as disclosed in U.S. Pat. No. 3,011,920. In the process disclosed, a colloidal solution composed of tin(II) and precious metal salts, generally with hydrochloric acid, is used. The effective catalyst is proposed to be a colloid of an elemental precious metal (e.g., palladium stabilized by the excess stannous chloride present in the medium. While the system disclosed in U.S. Pat. No. 3,011,920 has been quite popular in commercial practices, rising costs of precious metal, instabilities due to air oxidation, and miscellaneous product reliability problems have led to the quest for new systems in which the use of precious metal as well as of hydrochloric acid would be completely eliminated.

In meeting this objective it was found, as described in U.S. Pat. Nos. 3,958,048, 3,993,491, 3,993,799, and 4,087,586 that colloidal systems based upon non-precious metals could constitute the basis for new commercial plating processes. More specifically, it was found and reported that colloidal compositions of non-precious metals (preferably selected from the group of copper, cobalt, iron, nickel and manganese) may be used in the direct replacement of the tin/palladium colloid followed by a treatment (which may be optional) in a suitable reducing (activating) medium. In the latter treatment a precursor derived from the colloidal dispersion constitutes the catalytic sites useful in the initiation of plating. In the reducing medium, reduction of the ionic portion of the adduct derived from adsorption in the colloidal medium takes place, or surface activation, which results in active nucleating sites capable of initiation of the electroless process. Alternatively, the second step may encompass the selective dissolution of a colloid stabilizer(s) thereby exposing the catalytic nucleus of the colloid.

In reviewing the teaching disclosed in the aforementioned issued patents which are included herein by reference, it is recognized that many of the inherent disadvantages associated with the palladium based catalysts are eliminated. It is further recognized that based upon practices in this art it is further essential that any catalytic system should maintain its properties especially with storage (e.g., several months) and shipment under conditions of substantial temperature fluctuation. It is thus highly desirable to have a medium in which good colloidal stability would be maintained, and which at the same time has sufficient catalytic activity to be used in the plating process. I have observed that as one increases stability, activity is decreased thereby making it difficult to meet both requirements in a single preparation step.

For example, I have observed that with successful systhesis of active plating colloids, there is generally a limited stability (for long term purposes) due to coagulation which takes place leading to precipitation, with, of course, change in particle size and distribution during the coagulation process. Also, at times dissolution of the colloidal state may also take place with time. In addition, I have noted that highly stable colloidal dispersions have shown limited catalytic activity when used in accordance with U.S. Pat. No. 3,993,799 with a moderate concentration of reducing medium or activating medium or the omission of any secondary step. Similar trends were also noted in U.S. Pat. No. 3,948,048 on the interrelationship between reactivity and stability. In fact, in U.S. Pat. No. 3,958,048 most of the illustrated examples, when repeated, lost their colloidal character and became true solutions within 24 hours.

It is thus highly desirable to provide stable colloidal dispersions and at the same time provide a simple way by which the stable colloids, though weakly active, may be transformed into an active catalytic state (form) useful in electroless plating processes or any other processes utilizing colloids without major sacrifice in stability. It is further desirable to obtain dispersions with very fine particle size distributions. Small size dispersions are particularly useful in adsorption processes and catalysis, and in particular tend to exhibit good stability.

While not wishing to be repetitious, the following are included herein by reference: U.S. Pat. Nos. 3,011,920, 3,993,799, 3,958,048, 3,993,491, 3,993,801, 4,087,586 and 4,048,354 and applications Ser. No. 731,212 now U.S. Pat. No. 4,136,216, 820,904 now U.S. Pat. No. 4,131,699, 833,905 now U.S. Pat. No. 4,151,311 and 854,909 now U.S. Pat. No. 4,132,832.

SUMMARY OF THE INVENTION

A method for the activation of weakly active colloidal dispersions useful in the preparation of non-conductors prior to electroless (or chemical) plating has been been developed. The method is based upon the controlled oxidation of otherwise weakly active colloids by treatment with suitable gases and/or chemical agents which render said controlled oxidation.

DETAILED DESCRIPTION OF THE INVENTION

The process and method of the present invention is applicable to the metallic plating of dielectric substrates by autocatalytic or as more commonly known, electroless plating. Such processes are well known in the art and they produce a wide variety of products varying from printed circuitry arrays to decorative plated plastics parts.

In some of the above applications the colloids are used after preparation without any further change; however, in others changes may be induced after preparation, e.g., change in the oxidation state of a portion of the colloid.

Although there are many methods for the preparation of colloidal dispersion, the use of the precipitation (chemical) method has been quite popular. In the latter method, the insoluble phase is developed (nucleated) through the interaction of at least two reactants, e.g., a metal compound with a metal reducing agent, or alternately, a soluble metal salt with an alkaline agent. Both reactants should preferably be soluble in a suitable solvent. For general survey of preparatory methods see B. Jirgensons and M. E. Straumanis, "A Short Textbook of Colloid Chemistry," 2nd Edition, The MacMillan Company, New York (1962). The present invention would be illustrated through the preparation of colloidal dispersions by precipitation (chemical) method; however, it is clear that the invention is not limited to the preparation method selected.

The method described in this invention may be applied to any of several colloidal compositions of non-precious metals; the metal may be part of a compound, alloy, or in the metallic state, as well as combinations thereof. Preferred metals are those which are catalytic for electroless metal deposition. Such metals are well known in the art and they are recited in U.S. Pat. Nos. 3,011,920, 3,993,799 and many others.

The term "colloid stabilizer" as used herein is intended to encompass substances which alter the characteristics of the colloid so as to prevent, delay, or minimize their coagulation and precipitation. It is believed that these stabilizers are adsorbed onto the surface of the colloids thereby altering the surface charge and hence their stability. Stabilizers contemplated by the present process and composition may include but are not limited to secondary colloids, protein, gelatin, agar agar, gum arabic, surfactants, sugars and polyalcohols (glycerol), and miscellaneous chemicals derived from wood, e.g., lignin, hemicellulose. It is noted that gelatin is a form of protein. In the general sense it is recognized that stabilizers are inherently adsorbed onto the nucleus of the colloid or participate within the double-layer structure of the colloid. Moreover, it is recognized that in the colloidal dispersion at least one colloid stabilizer must be present.

The term "surfactant" (or surface active agent) as used herein generally refers to substances which are capable of lowering the surface tension of a liquid or the interfacial tension between two liquids. All useful surfactants possess the common feature of a water-soluble (hydrophilic) group attached to an organic (hydrophobic) chain. Surfactants as used herein are also intended to encompass detergents, dispersants, and emulsifying agents regardless of whether or not they lower the surface tension of a liquid (e.g., water).

The term "controlled oxidation" as used herein generally refers to a chemical oxidation of the colloidal product; however, said oxidation is controlled. Specifically, the oxidizing agent(s) used to achieve the oxidation is added to the weakly active colloidal dispersion or powder thereof, in a controlled amount. The addition of such controlled amount appears to activate the weakly active colloids so that they are more useful in the electroless process or other redox processes. However, excess addition significantly above the level required for activation generally leads to deterioration in the stability and/or performance of the colloid which is thus undesirable and not attractive to the process.

Useful oxidizing agents may contain oxygen but they are not limited to such. Oxidizing agent(s) may be gaseous, liquid or solid forms as well.

Typical oxidizing agents may be materials which could release oxygen or any of several compounds bearing oxygen in them. Typical materials are: air, hydrogen peroxide, permanganate, nitrates, persulfate, and the like, which are well known to one skilled in the art.

While I do not wish to be bound by theory, it is believed that the novelty of the controlled oxidation relates to the oxidation of the weakly active colloid to some intermediate oxidation state, and the presence of at least one colloid stabilizer within the suspension permits the stabilization of such intermediate state. This intermediate state has a higher catalytic activity when used in the process under consideration. However, overoxidation generally leads to perhaps a higher oxidation state which manifests itself in a tendency for agglomeration or dissolution of the particles which is noted by a rapid destabilization of the colloid. This phenomenon can be seen visually. It is also interesting to note that various products similar to the examples submitted herein were examined by electron microscopy using a control colloid as a reference point (weakly active). Those colloids which were oxidized according to the teaching of the preferred instant invention (in a controlled manner) were distinctly different from the overoxidized colloids. In addition, both of these were distinct in appearance from the control. This observation is apparent both from transmission mode of electron microscopy and from the diffraction mode of electron microscopy.

The following examples are provided to illustrate the findings of the present invention and in particular the controlled oxidation of the weakly active colloidal dispersions. These examples are not to be taken as in limitation of the invention, but it should be recognized that the invention encompasses various combinations thereof. In demonstrating the present invention and the determination of the colloid effectiveness, the following procedure was adopted.

Specifically, etched ABS substrates were contacted with the colloidal dispersions for a few minutes followed by water rinse, and thereafter placed in an activator solution comprised of 0.5 g/l dimethylamine borane at 55° C. and rinsed. Finally, electroless copper was used at room temperature. The bath used was a commercial electroless copper (404) operating at room temperature. In most tests examination was made for the induction time and/or percent metallic coverage after about 1 minute of plating. Shorter induction times and/or increased metallic coverage reflect increased activity of the colloid in the process. One skilled in the art should recognize in view of the references incorporated above that as long as there is use of the controlled oxidized colloid which is otherwise weakly active, and use of electroless plating, such use falls within the spirit of the invention whether the above activation step(s) is incorporated or eliminated. Moreover, in the colloidal composition at least one catalytic metal must be present although based upon the above references and examples herein, secondary metals in any of several oxidation states (from positive to negative oxidation states) may be included.

EXAMPLE 1

A colloidal composition comprising the admixture of the following chemicals was nucleated above room temperature. The nickel was added post copper colloid nucleation and final pH was adjusted to 8.0.

| | |
|---|---|
| $CuCl_2$ | 0.04M |
| $NiCl_2$ | 0.01M |
| $NaBH_4$ | 0.039M |
| NaOH | 0.196M |
| $(NH)_2CS$ | 0.0067M |
| Orzan-S | 12.0g/l |

[Orzan-S is a product of Crown Zellerbach Corp.]

Using two 200 ml aliquots of the above colloidal product, 2.3 liters and 4.6 liters of air were bubbled through each, respectively. At the same time a portion of the colloid was unperturbed (control) and was tested for comparison. Evaluation of the colloids has shown:

| Control | 40% and 10% metallic coverage |
|---|---|
| 2.3 liter test | 10 sec and 100% metallic coverage |
| | 8 sec and 100% metallic coverage |
| 4.6 liter test | 11 sec and 80% metallic coverage |
| | 18 sec and 75% metallic coverage |

Hence, it is evident that using a controlled oxidation does improve the performance of the weakly active colloidal catalytic dispersion.

EXAMPLE 2

The colloidal composition was prepared through the admixture of the following components which were nucleated above room temperature and to which the nickel salt was added after the colloid was nucleated, with pH finally adjusted to 8.0, this being the starting product, i.e., control.

| $CuCl_2$ | 0.04M |
|---|---|
| $NiCl_2$ | 0.01M |
| $NaBH_4$ | 0.033M |
| NaOH | 0.330M |
| $(NH_2)_2CS$ | 0.0067M |
| Orzan-S | 12.0g/l |

To a portion of said control (1750 ml volume) 1.5 ml of 30% hydrogen peroxide was added. Plating results revealed that the control resulted in no plating while the modified portion (via controlled oxidation) resulted in 6 sec induction time and 100% metallic coverage and also 9 sec induction time and 100% metallic coverage. In this experiment hydrogen peroxide was used to achieve the controlled oxidation.

EXAMPLE 3

A colloidal composition comprising of the admixture of the following reactants was prepared and the nucleation of the colloidal state was carried out above room temperature, e.g., 60° C., with final adjusted pH of 8.0 and nickel added post colloid nucleation, as before.

| $CuCl_2$ | 0.04M |
|---|---|
| $NiCl_2$ | 0.01M |
| $NaBH_4$ | 0.039M |
| NaOH | 0.196M |
| $Sn(BF_4)_2$ | 0.196M |
| Arabic Gum | 11.9g/l |

A portion of this colloid was maintained without any further treatment and is designated as control. Another portion was taken and a limited quantity of air was bubbled through. Induction times and metallic coverage were as follows:

| Control | 29 sec and 20% coverage |
|---|---|
| | 24 sec and 80% coverage |
| Controlled oxidation product | |
| | 16 sec and 100% coverage |
| | 18 sec and 100% coverage |

EXAMPLE 4

The colloidal composition of example 1 was used except for $NaBH_4$ at 0.019 M and NaOH at 0.19 M. Control (without any controlled oxidation) showed no significant plating whereas the addition of 20 ml of stock solution (41.4 g/l $KMnO_4$) was added to 100 ml volume of control and has resulted in 100% plating with an induction time of 5 seconds.

It is interesting to note that examination of some of the colloid products as prepared, controlled oxidized, or overoxidized, when examined via electron microscopy have revealed distinct changes in both the transmission and diffraction patterns.

EXAMPLE 5

A colloidal composition comprising the admixture of the following chemicals was prepared and nucleated between 50° to 60° C. The nickel was added post copper colloid nucleation, and final pH was adjusted to 8.0.

| $CuCl_2$ | 0.04M |
|---|---|
| $NiCl_2$ | 0.01M |
| $NaBH_4$ | 0.019M |
| NaOH | 0.19M |
| $(NH_2)CS$ | 0.0175M |
| Orzan-S | 12.0g/l |

This composition was used without change to activate etched ABS plaques. However, a follow-up step of controlled oxidation was carried out after the adsorption of the colloid onto the non-conductor. The oxidizing medium was hydrogen peroxide at 0.3% and immersion time of 2 minutes at room temperature. All other steps were the same. Results showed a significant plating improvement over the control which did not have the controlled oxidation step as a follow-up.

While the above examples are provided to illustrate the novel aspects of the present invention one skilled in the art should recognize that many other chemicals and means may be used to achieve the useful results of this invention. Such adaptations and modifications fall within the spirit of the present invention. Furthermore, it is possible that the colloidal composition may be prepared by the suspension of an available dry powder or semi-dried powder in a suitable solvent. Such approach in combination with the controlled oxidation falls within the spirit of this invention.

What I claim is:

1. A process for the metallizing of a non-conductor substrate by electroless (chemical) metal deposition comprising the steps of:
   (1) contacting said substrate with an activated colloidal dispersion comprising of non-noble catalytic metal capable of electroless plating initiation and wherein said metal may be part of an alloy or elemental state and mixtures thereof and wherein said activated colloidal dispersion is prepared by the admixing of a chemical oxidizing agent with a weakly active stable colloidal dispersion and wherein said admixing is carried forth in a manner of achieving a controlled oxidation and thereby producing the activated colloidal dispersion, and
   (2) contacting the treated substrate with an electroless plating bath for the deposition of a metal.

2. The process according to claim 1 wherein said catalytic metal is copper.

3. The process according to claim 1 wherein said weakly active colloidal dispersion was prepared by the interaction of catalytic metal ions with a reducing agent.

4. The process according to claim 1 wherein said colloidal dispersion is derived by the suspension of a dry powder or semi-dried powder in a suitable solvent.

5. The process according to claim 4 wherein said solvent is water.

6. The process according to claim 1 wherein said colloidal composition further contains thio containing compounds.

7. The process according to claim 6 wherein said thio is thirurea.

8. The process according to claim 1 wherein said controlled oxidation is achieved by the addition of a chemical oxidizing agent.

9. The process according to claim 1 wherein said controlled oxidation is achieved by dispersion of a gas.

10. The process according to claim 1 wherein said electroless metal deposition is copper.

11. The process according to claim 1 wherein said weakly active colloidal dispersion is prepared by a precipitation reaction.

12. The process according to claim 1 wherein said controlled oxidation is carried forth utilizing hydrogen peroxide.

13. The process according to claim 1 further containing the step of contacting the non-conductor substrate with a reducing composition.

14. The process according to claim 1 wherein said non-conductor substrate is a plastic.

15. The process according to claim 1 further containing the step of water rinsing.

16. The process according to claim 1 wherein said colloidal dispersion is aqueous based.

17. The process according to claim 1 further containing the step of activation and wherein said activation takes place prior to the step of electroless plating.

18. The process according to claim 1 wherein said substrate is etched prior to the step of contacting the substrate with said activated colloidal dispersion.

19. The process according to claim 1 wherein said electroless plating bath is electroless copper and is operative at room temperature.

* * * * *